(12) United States Patent
Oppermann et al.

(10) Patent No.: US 8,884,437 B2
(45) Date of Patent: Nov. 11, 2014

(54) ELECTRICAL DEVICE WITH PROTRUDING CONTACT ELEMENTS AND OVERHANG REGIONS OVER A CAVITY

(71) Applicant: Infineon Technologies AG, Neubiberg (DE)

(72) Inventors: Klaus-Guenter Oppermann, Holzkirchen (DE); Martin Franosch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/686,436

(22) Filed: Nov. 27, 2012

(65) Prior Publication Data
US 2013/0082392 A1    Apr. 4, 2013

Related U.S. Application Data

(62) Division of application No. 12/172,373, filed on Jul. 14, 2008, now Pat. No. 8,319,344.

(51) Int. Cl.
| | |
|---|---|
| *H01L 23/48* | (2006.01) |
| *H01L 23/52* | (2006.01) |
| *H01L 29/40* | (2006.01) |
| *H01L 23/488* | (2006.01) |
| *H01L 23/498* | (2006.01) |
| *H01L 21/48* | (2006.01) |
| *H01L 23/00* | (2006.01) |

(52) U.S. Cl.
CPC ..... *H01L 23/488* (2013.01); *H01L 2224/05552* (2013.01); *H01L 2924/01074* (2013.01); *H01L 2224/1131* (2013.01); *H01L 2924/01078* (2013.01); *H01L 2924/01014* (2013.01); *H01L 23/49816* (2013.01); *H01L 2924/01068* (2013.01); *H01L 2224/16* (2013.01); *H01L 2224/131* (2013.01); *H01L 2924/01072* (2013.01); *H01L 2924/19042* (2013.01); *H01L 2924/01082* (2013.01); *H01L 2924/14* (2013.01); *H01L 21/486* (2013.01); *H01L 24/11* (2013.01); *H01L 24/81* (2013.01); *H01L 2924/19043* (2013.01); *H01L 2224/812* (2013.01); *H04L 2924/01032* (2013.01); *H01L 2924/10329* (2013.01); *H01L 2924/01006* (2013.01); *H01L 2224/05599* (2013.01); *H01L 2924/00014* (2013.01); *H01L 2924/01005* (2013.01); *H01L 2924/014* (2013.01); *H01L 2924/01033* (2013.01); *H01L 2924/12044* (2013.01); *H01L 24/05* (2013.01); *H01L 2224/13099* (2013.01); *H01L 2224/81801* (2013.01)

USPC ........... 257/773; 257/621; 257/774; 257/778; 257/779; 257/E23.067; 257/E23.174

(58) Field of Classification Search
CPC ................. H01L 2924/00; H01L 2924/00014; H01L 2224/32225; H01L 2224/48227; H01L 2224/73265; H01L 2224/81801; H01L 2924/014; H01L 2924/01068; H01L 2924/14; H01L 24/05; H01L 24/11; H01L 23/488; H01L 2924/10329; H01L 2924/16; H01L 2924/01074; H01L 24/81; H01L 21/486; H01L 2224/1131; H01L 2224/812; H01L 23/49816; H01L 2224/05599; H01L 2224/131; H01L 2224/13099; H01L 2924/12044; H01L 2924/01033; H01L 2924/19042; H01L 2924/01082; H01L 2924/01005; H01L 2924/01006; H01L 2924/19043; H01L 2924/01032; H01L 2924/01078; H01L 2924/01072; H01L 2924/01014; H01L 2224/05552
USPC .......... 257/621, 773, 774, 778, 779, E23.067, 257/E23.069, E23.174
See application file for complete search history.

(56) References Cited

U.S. PATENT DOCUMENTS

| | | |
|---|---|---|
| 3,290,566 A | 12/1966 | Kasper et al. |
| 5,463,269 A | 10/1995 | Zimmerman |

(Continued)

FOREIGN PATENT DOCUMENTS

JP    2002158191    5/2002

OTHER PUBLICATIONS

Non-Final Office Action mailed Jan. 26, 2012 in U.S. Appl. No. 12/172,373.

(Continued)

*Primary Examiner* — Teresa M Arroyo
(74) *Attorney, Agent, or Firm* — Dicke, Billig & Czaja, PLLC

(57) ABSTRACT

A device with contact elements. One embodiment provides an electrical device including a structure defining a main face. The structure includes an array of cavities and an array of overhang regions, each overhang region defining an opening to one of the cavities. The electrical device further includes an array of contact elements, each contact element only partially filling one of the cavities and protruding from the structure over the main face.

20 Claims, 7 Drawing Sheets

(56) References Cited

U.S. PATENT DOCUMENTS

| | | | |
|---|---|---|---|
| 5,486,483 | A | 1/1996 | Lammert |
| 5,668,399 | A | 9/1997 | Cronin et al. |
| 5,926,731 | A | 7/1999 | Coapman et al. |
| 5,980,270 | A * | 11/1999 | Fjelstad et al. .............. 439/71 |
| 6,047,044 | A | 4/2000 | Lehmann et al. |
| 6,054,761 | A | 4/2000 | McCormack et al. |
| 6,125,043 | A | 9/2000 | Hauer et al. |
| 6,191,489 | B1 | 2/2001 | Igel et al. |
| 6,329,605 | B1 | 12/2001 | Beroz et al. |
| 6,449,839 | B1 | 9/2002 | Glovatsky et al. |
| 6,455,921 | B1 * | 9/2002 | Ramaswami et al. ........ 257/622 |
| 6,495,865 | B2 | 12/2002 | Johnson et al. |
| 6,528,881 | B1 | 3/2003 | Tsuboi |
| 6,689,412 | B1 | 2/2004 | Bourrieres |
| 6,689,678 | B2 | 2/2004 | James et al. |
| 6,743,499 | B2 | 6/2004 | Suemasu et al. |
| 6,803,312 | B2 | 10/2004 | Sato |
| 7,170,172 | B2 | 1/2007 | Tomimori et al. |
| 7,217,890 | B2 | 5/2007 | Suemasu et al. |
| 7,300,823 | B2 | 11/2007 | Franosch et al. |
| 7,745,321 | B2 | 6/2010 | Martin et al. |
| 2001/0040290 | A1 | 11/2001 | Sakurai et al. |
| 2002/0070423 | A1 | 6/2002 | Takafuji |
| 2003/0096089 | A1 | 5/2003 | Huang et al. |
| 2007/0267754 | A1 | 11/2007 | Kirby et al. |
| 2008/0029850 | A1 | 2/2008 | Hedler et al. |
| 2009/0179333 | A1 | 7/2009 | Martin et al. |

OTHER PUBLICATIONS

Office Action mailed Dec. 1, 2010 in U.S. Appl. No. 12/172,373.
Non-Final Office Action mailed Jun. 23, 2010 in U.S. Appl. No. 12/172,373.

\* cited by examiner

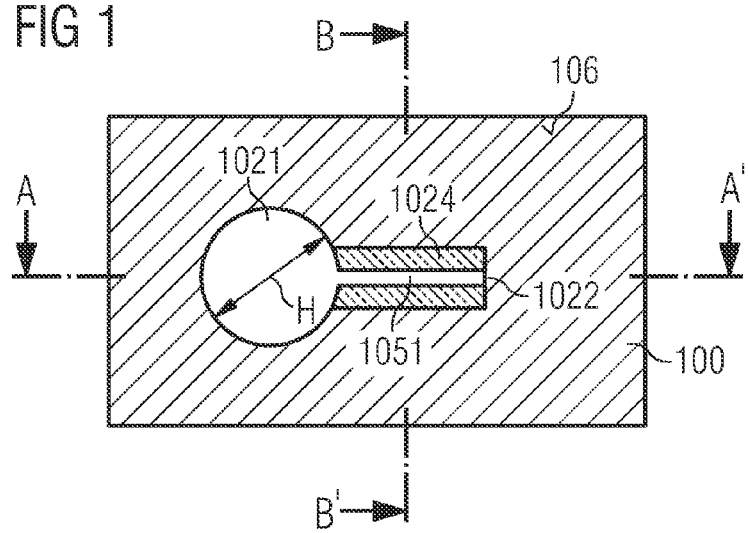
FIG 1
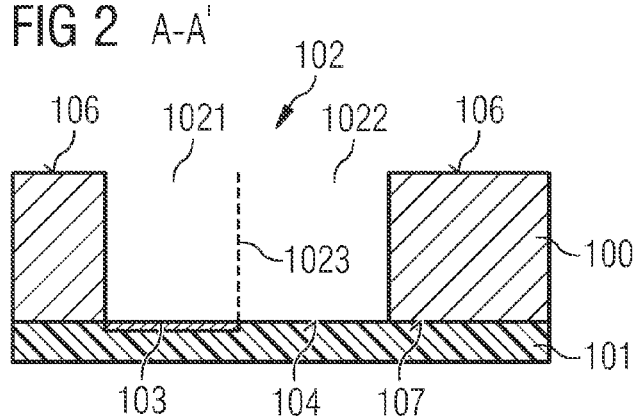
FIG 2 A-A'
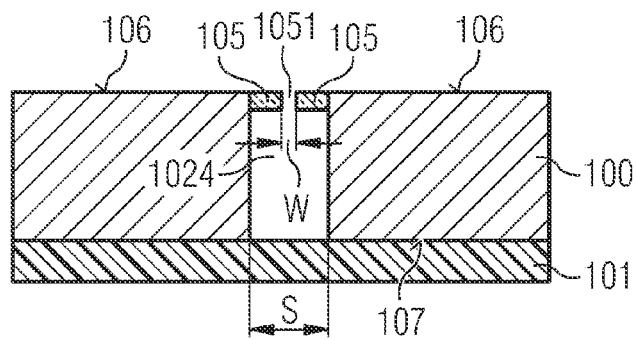
FIG 3 B-B'

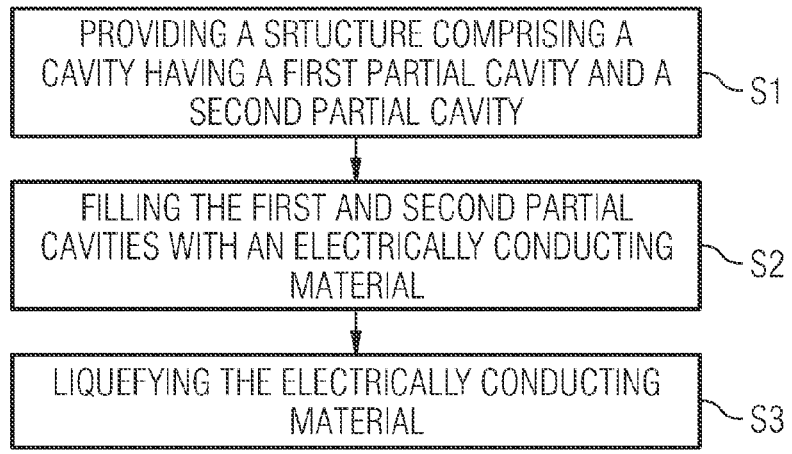
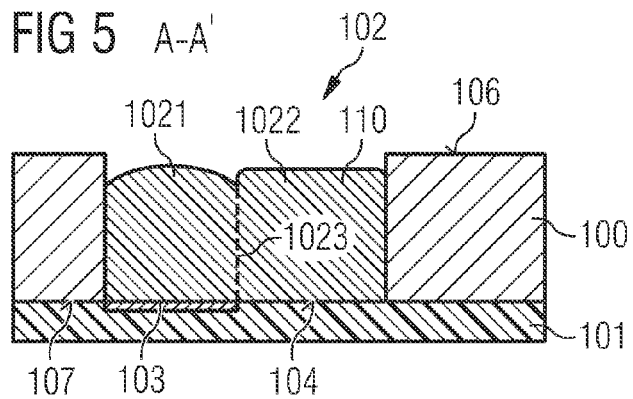
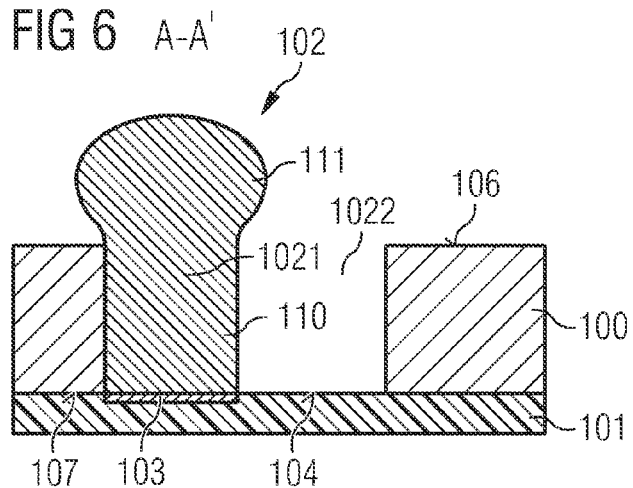

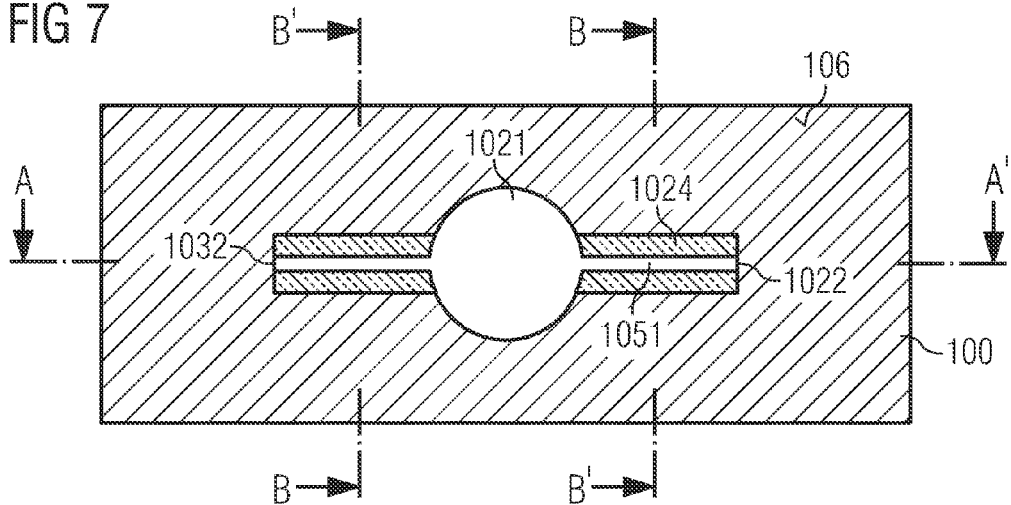
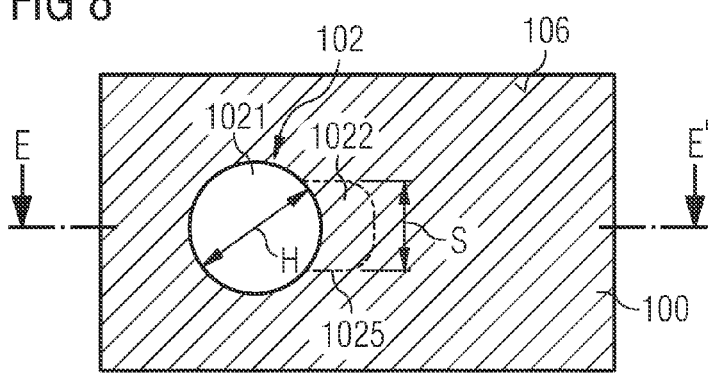
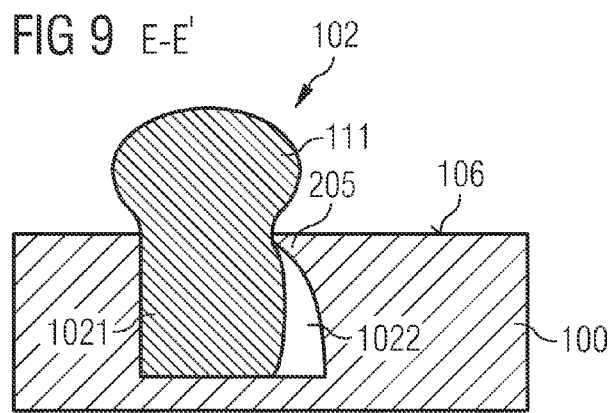

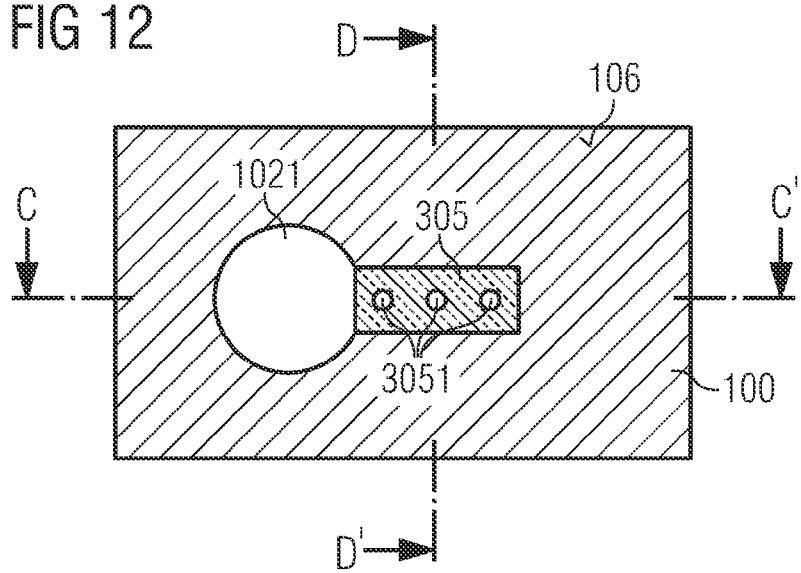
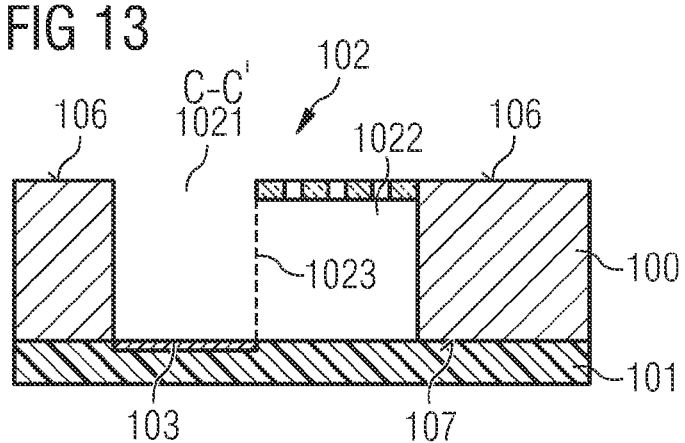
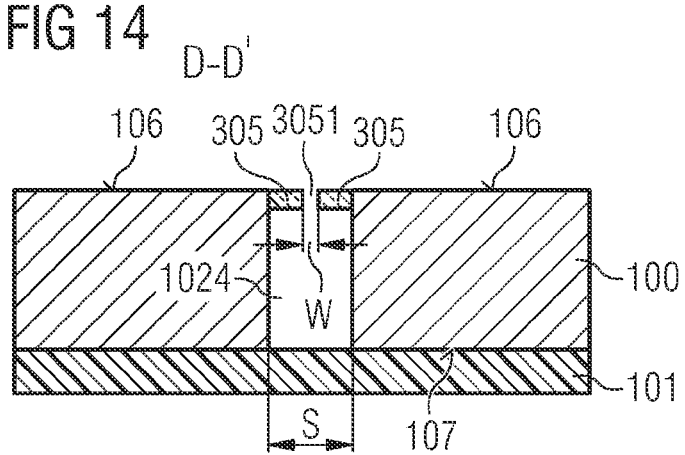

1. Decompressing

ELECTRICAL DEVICE WITH PROTRUDING CONTACT ELEMENTS AND OVERHANG REGIONS OVER A CAVITY

CROSS-REFERENCE TO RELATED APPLICATIONS

This Utility Patent Application is a divisional application of U.S. application Ser. No. 12/172,373 filed Jul. 14, 2008, which is herein incorporated by reference.

BACKGROUND

The invention relates to electrical devices with contact elements, and the technique of forming electrical and mechanical connections.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a top view of a structure according to one embodiment.

FIG. 2 illustrates a sectional view of one embodiment of the structure of FIG. 1 along line A-A'.

FIG. 3 illustrates a sectional view of one embodiment of the structure of FIG. 1 along line B-B'.

FIG. 4 illustrates a flowchart illustrating a method of manufacturing an embodiment.

FIG. 5 illustrates a sectional view of one embodiment of the structure of FIG. 1 along line A-A' in a first stage during manufacturing.

FIG. 6 illustrates a sectional view of one embodiment of the structure of FIG. 1 along line A-A' in a second stage during manufacturing.

FIG. 7 illustrates a top view of a structure according to one embodiment.

FIG. 8 illustrates a top view of a structure according to one embodiment.

FIG. 9 illustrates a sectional view of one embodiment of the structure of FIG. 8 along line E-E'.

FIG. 12 illustrates a top view of one embodiment of a structure according to a fourth embodiment.

FIG. 13 illustrates a sectional view of one embodiment of the structure of FIG. 12 along line C-C'.

FIG. 14 illustrates a sectional view of one embodiment of the structure of FIG. 12 along line D-D'.

DETAILED DESCRIPTION

Figure 10:
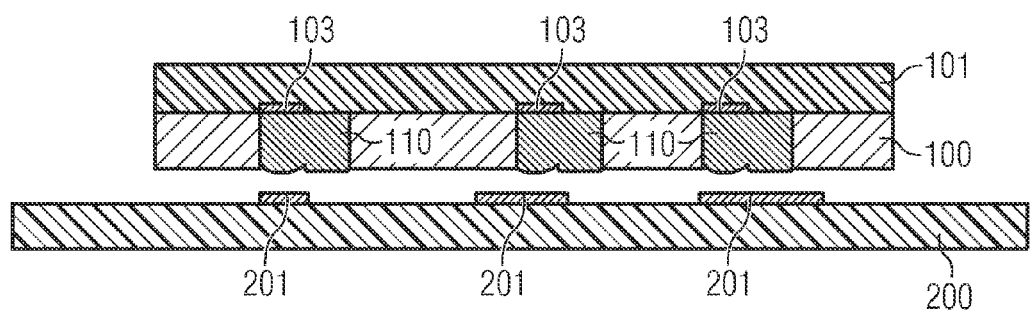
FIG. 10 illustrates a sectional view of one embodiment of a structure positioned opposite to a mounting platform.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The structures described herein may be arranged on a semiconductor chip. They may serve as contact structures to provide for electrical contact elements to be coupled to external applications such as PCBs (Printed Circuit Boards) or other types of chip carriers. Further, they may serve as housings or packages to accommodate active or passive components or mechanical members. As an example, such housings may be used to accommodate BAW (Bulk Acoustic Wave) filters on semiconductor chips or so-called MEMS (Micro-Electro Mechanical Systems), wherein micro-mechanical moveable structures such as, for example, bridges, membranes or reed structures may be provided within the housing. Such micro-mechanical movable structures are for instance implemented in various types of sensors such as e.g., microphones, acceleration sensors, etc. The structures described herein may be made of photoresist materials, or mold materials such as e.g., silicone or epoxy resin based plastics as employed for semiconductor device packaging could be used.

Further, the structures could serve as semiconductor devices. In this case, they may be made of semiconductor materials, e.g., may include silicon substrates, germanium substrates, GaAs substrates, SiC substrates, fully or partially oxidized macroporous silicon, etc. They may include integrated active components, e.g., transistors, diodes, movable mechanical structure elements, optical detectors or emitter elements, sensor elements, etc.

Still further, the structures described herein may serve as carriers to hold in place active or passive semiconductor devices, e.g., chips, resistors, inductors etc. In this case, the structures may be designed as PCBs, dielectric carriers, multilayer carriers such as e.g., build-up layers of SBU (Sequential Build-Up) laminate substrates, intermediate carriers often referred to as "interposers", ceramic substrates or any other types of mounting platforms used to mount active or passive semiconductor devices. Structures serving as carriers may be made of dielectric materials or of the same semiconductor materials as mentioned above and may optionally also include integrated active components as mentioned above. If semiconductor structures are used as carriers, they can receive one or a plurality of further semiconductor substrates (i.e. "chips") which themselves may serve as carriers and/or which may include integrated active components. In this way, a semiconductor structure can be used as a carrier for producing compact, highly integrated "system in package" (SiP) modules.

In one or more embodiments, the structures described herein may embed one or more passive or active component or may merely have the function of a carrier for supporting one or more passive or active component (e.g., integrated circuits) or may both embed one or more passive or active components and support one or more other structures embedding one or more passive or active component.

The structures described herein include at least one cavity extending from a main face of the substrate into the substrate. This cavity is used as a hole for an electrically conducting feedthrough or via. Electrically conducting feedthroughs may reach from one main surface to the other main surface of the structure, i.e. penetrate the structure. In one embodiment, the cavities may be blind holes which extend from one main surface of the structure to connect to an internal wiring of the structure such as e.g., a metal layer in a multi-layer PCB or SBU or a metal layer within an integrated circuit.

The cavities may be made by various methods. In many cases, e.g., if the structure is made of a semiconductor or resist material, photolithography is a suitable process of manufacturing such cavities.

The cavities in the structure can have particularly small cross-sectional areas and pitches. If the structure is e.g., made of a semiconductor material, it is possible to produce a cavity density on the structure's surface which corresponds to the lateral structural dimensions of an integrated semiconductor, e.g., which may be as small as a few 100 nm. If the structure is made of a resist, the cavity density on the structure's surface may still be as small as a few µm. Wirings on both sides of the structure can thus be electrically interconnected. In this way, it becomes possible to produce short electrical connections between electronic components which are arranged on opposite main surfaces of the structure or within a structure and at one or both main surfaces of the structure. As a result, a predetermined structure's surface can be utilized economically and package sizes can be minimized. For example, it is possible to produce direct interconnects between contact parts arranged on one main surface of the structure and chip contacts of an integrated circuit to which the structure is mounted. As the positions of the electrically conductive feedthroughs are aligned to the positions of the chip contacts, the feedthroughs may provide short connections to the contact parts in order that, for example, fast signals (e.g., RF signals) are passed outwards to external circuitry in a manner free of interference and with a minimum delay.

The electrically conducting material brought into the at least one cavity may be introduced by a molten bath liquid metal filling process. Such molten bath liquid metal filling processes are inexpensive and suitable for structures made of many different materials. Other possible techniques to introduce the electrically conducting material into the cavities are CVD (Chemical Vapor Deposition), PVD (Physical Vapor Deposition), galvanic or electroless plating or printing processes.

FIGS. 1 to 3 illustrate one embodiment of a structure 100 which is arranged on a substrate 101 and accommodates an cavity 102. Typically, a plurality of such cavities 102 is comprised in the structure 102. The cavity 102 is composed of a first partial cavity 1021 and a second partial cavity 1022. The first partial cavity 1021 may be designed to have a circular shape in the top view of FIG. 1. The second partial cavity 1022 is fluidly connected to the first partial cavity 1021 and may be designed to have a slit-like trench shape in the top view of FIG. 1.

FIG. 2 illustrates a cross-sectional view along line A-A' in FIG. 1. Dashed line 1023 is used to illustrate the transition from first partial cavity 1021 to second partial cavity 1022. Both the first partial cavity 1021 and the second partial cavity 1022 may penetrate structure 100. The first partial cavity 1021 and the second partial cavity 1022 may be distinguished from each other in that a surface zone 103 of the first partial cavity 1021 is made of a wettable material such as e.g., a metal material or the like, whereas a surface zone 104 of the second partial cavity 1022 is made of a less- or non-wettable material. The surface zones 103, 104 may be located at the bottom of the first and second partial cavities 1021, 1022, respectively. As illustrated in FIGS. 2 and 3, the substrate 101 may define the bottom of the first and second partial cavities 1021, 1022. In this case, the wettable material of the surface zone 103 in the first partial cavity 1021 may be implemented by a metallization layer arranged on the substrate 101. The material of the surface zone 104 in the second partial cavity 1022 may be implemented by the bare material of the substrate 101 or may be made by a coating (such as e.g., a polymer coating, a $SiO_2$-coating or a $Si_3N_4$-coating) provided on the substrate 101. Further, it is to be noted that the bottom of the first partial cavity 1021 and the bottom of the second partial cavity 1022 are not required to be at the same level.

By way of example, the substrate 101 may be an integrated circuit (i.e. a chip). The wettable surface zone 103 may be implemented by a metallization layer, for instance a chip pad (i.e. a chip contact). As will be explained in more detail in conjunction with FIG. 17, the structure 100 as illustrated in FIGS. 1 to 3 may be part of a polymer housing to accommodate e.g., a BAW filter or a MEMS (Micro-Electro Mechanical System).

FIG. 3 illustrates a cross-sectional view of the arrangement illustrated in FIGS. 1 and 2 along section line B-B'. Section line B-B' extends from one main wall to the opposite main wall of the slit-like second partial cavity 1022. Thus, dimension S represents a minimum lateral dimension of the second partial cavity 1022.

The second partial cavity 1022 may be equipped with a constriction or overhang region 105 arranged at the opening of the second partial cavity 1022 in the vicinity of the upper surface 106 of structure 100. Generally, the overhang region 105 is designed to define a cross-sectional opening area 1051 of the second partial cavity 1022 which is smaller than a cross-sectional area 1024 defined by the walls of second partial cavity 1022 at a region beneath the overhang region 105.

In one embodiment, the overhang region 105 may e.g., be designed as a slit-like aperture as illustrated in FIGS. 1 to 3. In this case, the slit width W along section line B-B' may be smaller than the trench width S along section line B-B'.

A minimum lateral dimension of the first partial cavity 1021 is denoted by H in FIG. 1. Typically, H is substantially greater than the minimum lateral dimension S of the second partial cavity 1022 (measured beneath the overhang region 105). Thus the second partial cavity 1022 "opens out" in the first partial cavity 1021.

It is to be noted that a plurality of such second partial cavities 1022 may be provided in association with one first partial cavity 1021. By way of example, in one embodiment illustrated in FIG. 7, a second partial cavity 1032 opposite to the first partial cavity 1022 may be provided.

The production of the first and second partial cavities 1021, 1022 in the structure 100 may be carried out in many different ways which may depend on the material of the structure 100. For example, if the structure 100 is made of a photoresist material, the first and second partial cavities 1021, 1022 as well as the overhang region 105 may be formed by photolithography. In a first process, the structure 100 is generated as a continuous layer on substrate 101. Then, a first mask is used to expose the upper main surface 106 to a first radiation of, e.g., 365 nm wavelength. The first mask inhibits exposure of the structure 100 where the first and second partial cavities 1021, 1022 are to be formed. The first mask is aligned to the surface zone (metallization) 103 in order to guarantee that the first partial cavity 1021 will be formed in a vertical projection above an area which includes the surface zone 103, whereas the second partial cavity 1022 will be formed in a vertical projection besides the surface zone 103. The intensity and wavelength of the first radiation is chosen such that exposed parts of the structure 100 are completely penetrated by the first radiation.

A second mask is used to expose the region where the overhang region 105 is to be formed by a second radiation of e.g., 313 nm wavelength. In one example illustrated in FIGS. 1 to 3, a double stripe exposure pattern may be used for the second exposure. The wavelength and/or the intensity of the second radiation is chosen such that only a small penetration depth (e.g., about 0 to 10 μm or more) is used. The penetration depth of the second exposure defines the thickness of the overhang region 105 in a vertical direction (FIG. 3). Then, exposed parts of the structure 100 are etched. As a result, cavity 102 is produced.

If the structure 100 is made of a semiconductor material such as silicon, multi-layer etching constitutes one possible production variant. The upper main surface 106 of the semiconductor structure 100 may be made of a top layer having different etching properties than the semiconductor structure 100 beneath. The top layer may be a hard passivation layer such as e.g., an silicon-oxide, silicon-nitride or silicon-carbide layer. First, the opening area of the first partial cavity 1021 and the opening area 1051 of the second partial cavity 1022 are etched in the top layer using the semiconductor material (e.g., silicon) as an etch stop. Then, the first and second partial cavities 1021, 1022 are etched into the semiconductor material by using an appropriate isotropic or partly isotropic etchant. Thus, the overhang region 105 at the second partial cavity 1022 may be formed during the top layer etching and the cross-sectional areas within a cavity 102 may be set by controlling the etching parameters during the semiconductor material etch operation.

In one embodiment, the structure 100 may have a thickness within the range of 25 to 2000 μm, and optionally within the range of 50 to 250 μm. The first partial cavity 1021 may have a diameter or minimum lateral dimension H within a range of e.g., 2 to 200 μm, and optionally within a range of 20 to 100 μm, e.g., about 50 μm. The minimum lateral dimension S of the second partial cavity 1022 is smaller than the minimum lateral dimension H of the first partial cavity 1021 and may be less than 30 μm, in one embodiment 20 μm or even 10 μm. The width W of the overhang region 105 may only be a few μm, say 1, 2 or 5 or more μm smaller than the width S. For instance, the width W may be 5% smaller than the width S. However, it is also possible that the width W is considerably smaller than the width S, for instance by a factor of at least two, three or more.

Further, it is to be noted that the overhang region 105 may be replaced by a closure (not illustrated) which completely covers the second partial cavity 1022. In this case, there is no connection of the second partial cavity 1022 to the upper main surface 106 of the structure 100.

The first and second cavities 1021, 1022 may be designed to form through-holes or may be designed to form blind holes. In the second case, the substrate 101 is not needed. In this case, similar to the previous embodiments, the bottom or a side wall portion of the first partial cavity 1021 is to be covered with a surface zone 103 made of a wettable material (e.g., a metal material). In contrast thereto, no wettable or less-wettable material is provided at the bottom or side wall portion of the second partial cavity 1022. One embodiment of a manufacturing process of providing structure 100 including a cavity 102 having a first and a second partial cavity 1021, 1022, respectively, is referred to at Si in FIG. 4.

After formation of the cavity 102, the first and second partial cavities 1021, 1022 are filled by an electrically conducting material 110. This is referred to at S2 in FIG. 4 and is illustrated in FIG. 5. Filling can be effected in parallel for a plurality of cavities 102. In one embodiment, in order to fill the first and second partial cavities 1021, 1022, the structure 100 or arrangement 100, 101 illustrated in FIGS. 1 to 3 may be dipped into the melt of the electrically conducting material 110. That way the melt can simultaneously penetrate into the first and second partial cavities 1021, 1022 and will solidify on removal of the structure 100 or arrangement 100, 101 from the melt. One exemplary process illustrating this technique will be explained in more detail further below in conjunction with FIGS. 18A to 18D. Other approaches to fill the first and second partial cavities 1021, 1022 are also possible.

After e.g., completely filling the first and second partial cavities 1021, 1022 with the electrically conducting material 110, the conducting material 110 is heated. Heating causes the conducting material 110 to melt. See S3 of FIG. 4. In one embodiment, the melted conducting material 110 will remain in the first partial cavity 1021, because the wettable material in the surface zone 103 does not allow the liquid to leave the first partial cavity 1021. However, the second partial cavity 1022 is not equipped with a wettable surface zone. Therefore, the molten conducting material 110 in the second partial cavity 1022 is free to leave the second partial cavity 1022.

The fluid dynamics of the liquefied conducting material 110 largely depend on the dimensions of the first and second partial cavities 1021, 1022. Generally, due to the surface tension, the liquid conducting material 110 tends to reconfigure in a shape which is as round as possible within the constraints imposed by the geometry of the cavity 102 and the adhesive force of the wettable material in the surface zone 103. As the minimum width S of the second partial cavity 1022 is smaller than the minimum width H of the first partial cavity 1021, the liquid conducting material 110 will leave the second partial cavity 1022 and will protrude out of an opening of the first partial cavity 1021 over the main surface 106 of the structure 100. Note that no wettable surface zone is provided in the second partial cavity 1022 to inhibit this process.

Generally, with shrinking dimensions of the cavity 102, the surface tension of the molten conducting material 110 increases. Therefore, as S is smaller than H, the molten conducting material 110 has a higher capillary pressure in the second partial cavity 1022 than in the first partial cavity 1021. If the capillary pressure in the second partial cavity 1022 exceeds the ambient pressure (e.g., 1 bar), there happens to be a tendency for the liquefied conducting material 110 to leave the second partial cavity 1022 in a vertical direction instead of laterally discharging into the first partial cavity 1021. It has been found that in cases when S is less than about 30 μm, this undesired effect may occur. The constriction or overhang region 105 is provided to inhibit the liquefied conducting material 110 from leaving the second partial cavity 1022 in a vertical direction through the opening of the second partial cavity 1022 at the main surface 106. The ratio of the width W to the trench width S may be chosen according to the actual requirements which are affected by a plurality of parameters, amongst them the dimensions S, H, the surface tension of the used conducting material 110, the ambient pressure and any spurious oxidation of the liquefied conducting material 110 which may impede its reconfiguration in shape.

Due to the overhang region 105 (or, optionally, a corresponding closure of the second partial cavity 1022), molten conducting material 110 will leave the cavity 102 only at the opening of the first partial cavity 1021 to assume a rounded configuration in order to lower its internal energy. As a result, the protruding part of the molten conducting material 110 will form a ball-shaped contact part 111 located above the first partial cavity 1021. The second partial cavity 1022 will be devoid of the electrically conducting material 110, for example, as illustrated in the embodiment of FIG. 6. Thus, the second partial cavity 1022 may act as a reservoir for holding conducting material 110 which may subsequently be ejected to form the contact part 111. After solidifaction, a contact element having a contact part 111 protruding over the main surface 106 is formed. The contact element completely fills the first partial cavity 1021. In this and other embodiments, the contact element may have a volume which is smaller than two times the volume of the cavity 102 and larger than e.g., one half of the volume of the cavity 102.

FIGS. 8 and 9 illustrate views similar to FIGS. 1 and 2, respectively, of one embodiment. Cavity 102 is composed of a first partial cavity 1021 and a second partial cavity 1022. The first partial cavity 1021 is completely filled with a contact element made of the solidified conducting material 110. The contact element is composed of the ball-shaped contact part 111 and a portion of the solidified conducting material 110 filling and defining the first partial cavity 1021. The second partial cavity 1022 is devoid of the electrically conducting material 110. In one embodiment, the overhang region 205 at the second partial cavity 1022 may form a closure, i.e. a lid of the second partial cavity 1022 without any aperture at the main surface 106 of the structure 100. In another embodiment, the overhang region or constriction 205 may form an aperture or opening at the main surface 106 which connects to the second partial cavity 1022 and is not filled by conducting material 110, i.e. the contact element. In this case, the width W of this aperture may be smaller than the minimum lateral dimension of the first partial cavity 1021 (e.g., the diameter of the contact element) and/or may be in the range mentioned before. In FIG. 8, dashed line 1025 is a phantom line indicating the footprint of cavity 102. The bottom of the first partial cavity 1021 and the bottom of the second partial cavity 1022 are not required to be at the same level.

Further, the first and second partial cavities 1021, 1022 may be equipped with wettable and less-wettable surface zones, respectively, in order to assist the reconfiguration of the molten conducting material 110 into the protruding contact element as described before. Also in this respect, the description in conjunction with the embodiments described above applies. By way of example, these surface zones may be located at the bottom of the cavity 102 (which, by way of example, could be implemented by a substrate 101 as illustrated in FIGS. 2 and 3).

The method described above may be subjected to a number of alternate embodiments. Before heating, some agent which prevents or removes oxidation from the surface of the molten conducting material 110 may be added. A suitable flux or another reductive such as e.g., formic acid or a hydrogen plasma may be used. Heating may be performed in an inert gas atmosphere or a forming gas ($N_2H_2$) to avoid the building-up of an oxidation layer at the surface of the molten conducting material 110. Such oxidation layer could inhibit the discharge of the molten conducting material 110 out of the first partial cavity 1021.

The temperature which is necessary to melt and discharge the conducting material 110 from the first partial cavity 1021 may vary over a large range. If the structure 100 is made of a material with low temperature stability such as e.g., a polymer, a conducting material 110 has to be chosen to have low melting point. As an example, an SnAgCu solder may be used, which may have a melting point at or somewhat above 200° C. (e.g., about 220° C.) and will therefore not damage a polymer structure 100 during heating and melting.

Generally, the heating process may be performed at two different stages within the manufacturing and mounting process. One possibility is to perform the heating process to cause the so-called ball-attach. In this case, the heating process may be carried out at the manufacturer's plant in order to produce a structure 100 or arrangement 100, 101 having contact elements with contact parts 111 (e.g., solder bumps or solder balls) attached to the vias or feedthroughs established by the conducting material 110 within the first partial cavities 1021. Such structure 100 or arrangement 100, 101 will then be shipped to the customer. The customer will mount the structure 100 or arrangement 100, 101 to a suitable mounting platform such as e.g., a PCB by a conventional reflow process, i.e. by remelting the protruding contact parts 111 in the vicinity of the mounting platform. In this case, two reflow processes (ball-attach and reflow mounting) are necessary.

As an alternative, the manufacturer may refrain from performing the ball-attach heating process. In this case, the structure 100 or arrangement 100, 101 will be shipped to the customer with cavities 102 filled with the conducting material 110 but without ejected contact parts 111. Thus, the second partial cavities 1022 are still loaded when the structure 100 or arrangement 100, 101 is received by the customer. The discharge of the molten conducting material 110 out of the first partial cavity 1021 and the mounting of the structure 100 or arrangement 100, 101 to the mounting platform (e.g., PCB) may then be performed within one heating or reflow cycle at the customer's premises. The heating or reflow cycle is performed with the structure 100 or arrangement 100, 101 located next to the mounting platform.

Figure 11:
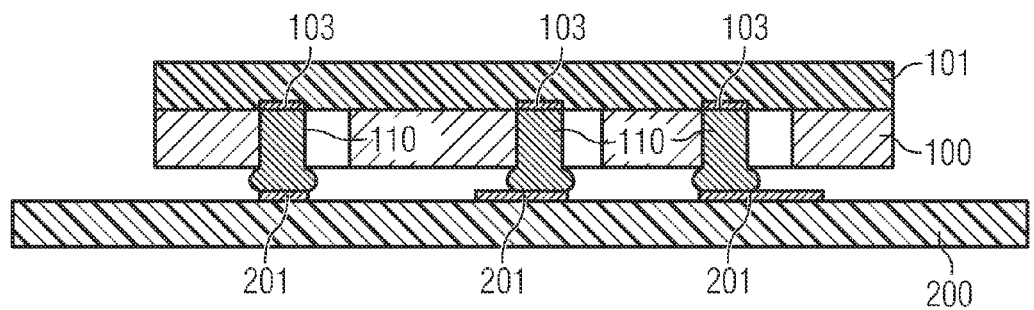
FIG. 11 illustrates a sectional view of one embodiment of a structure fixedly mounted to a mounting platform.

FIGS. 10 and 11 illustrate one embodiment of such a method by way of example. Arrangement 100, 101 is provided with filled cavities 102 and is positioned opposite to and in the vicinity of a mounting platform 200, e.g., a PCB, a motherboard, a module-in-package (MIP) board, a multi-module package (MMP), a carrier substrate, a chip carrier and/or any other entity which may connect the arrangement 100, 101 to an external circuitry. The mounting platform 200 is provided with electrically contact members 201 such as e.g., printed wires or conductor tracks. The heating or reflow cycle causes the contact parts 111 to expel from the first partial cavities 1021 and to engage with the contact members 201. As a result, after solidification of the electrically conducting material 110, the arrangement 100, 101 is fixedly mounted and electrically connected to the mounting platform 200 (FIG. 11).

According to another embodiment, the structure 100 or arrangement 100, 101 may be shipped to the customer with the cavities 102 still being unfilled with the conducting material 110. In this case, both the filling process and the mounting process are accomplished by the customer.

FIGS. 12 to 14 illustrate sectional views similar to FIGS. 1 to 3, respectively. The embodiment illustrated in FIGS. 10 to 14 is different from the embodiment illustrated in FIGS. 1 to 5 including the design of the constriction or overhang region 305. In one embodiment, the overhang region 305 is includes a covering which is equipped with a row of holes 3051. Analogously to overhang region 105, this type of overhang region 305 causes the second partial cavity 1022 to have a smaller cross-sectional opening area at the overhang region 305 than in a region beneath the overhang region 305. Here, the width W is represented by the diameter of the holes 3051. Except the different constitution of the overhang region 305, the description in conjunction with the embodiment illustrated in FIGS. 1 to 5 equally applies to the embodiment illustrated in FIGS. 12 to 14.

Further, in variations of the embodiments illustrated in FIGS. 1 to 3 and 12 to 14, the constriction or overhang region 105, 305 at the second partial cavity 1022 may be replaced by a closure, i.e. a lid without any aperture. The second partial cavity 1022 may then be completely closed in vertical direction. Also in this case, the description in conjunction with the embodiments described above applies.

Figure 15:
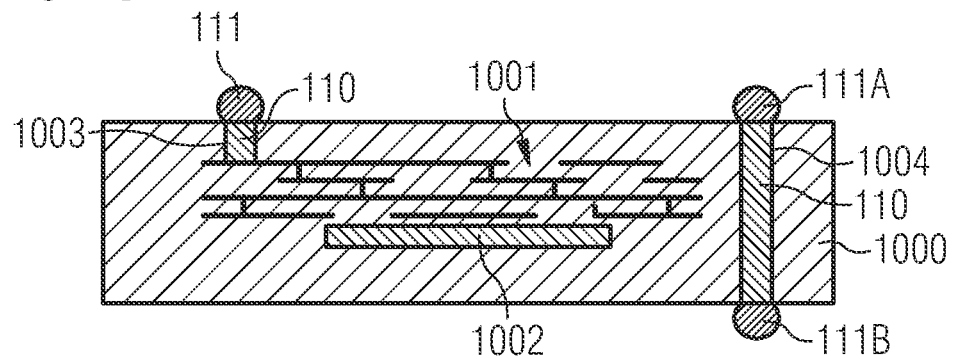
FIG. 15 illustrates a schematic representation of one embodiment of a semiconductor chip with protruding contact parts.
Figure 16:
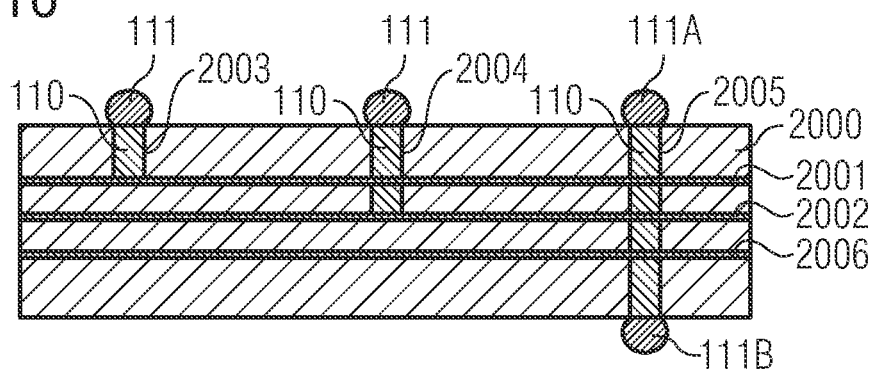
FIG. 16 illustrates a schematic representation of one embodiment of a carrier with protruding contact parts.
Figure 17:
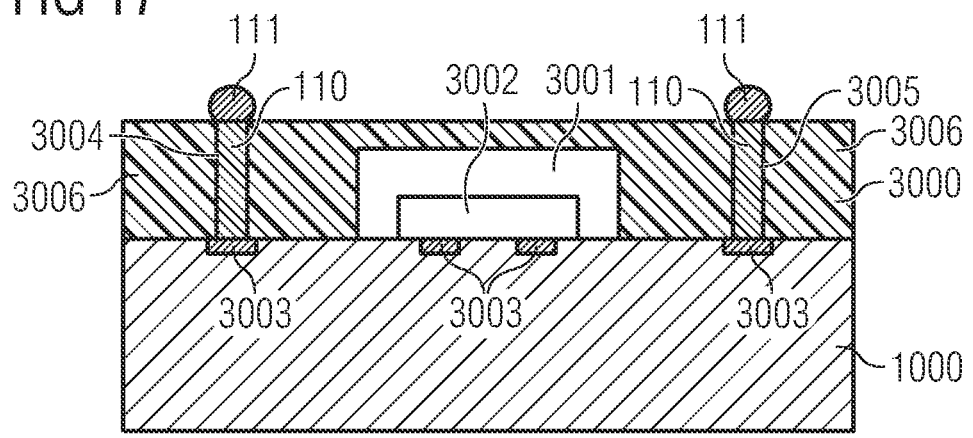
FIG. 17 illustrates a schematic representation of one embodiment of a polymer structure on a semiconductor chip, wherein the polymer structure includes protruding contact parts.

By way of example, FIGS. 15 to 17 illustrate various embodiments which use the principles of the aforementioned embodiments. Referring to FIG. 15, a semiconductor chip 1000 includes an internal wiring 1001 connected to an active component 1002 within the semiconductor chip 1000. A first conductive element 1003 made of a conducting material 110 interconnects the internal wiring 1001 to a contact part (e.g., solder ball) 111. A second conductive element 1004 made of a conducting material 110 is designed as a feedthrough and connects a first contact part (e.g., solder ball) 111A at one main surface of the semiconductor chip 1000 to a second contact part 111B at the opposite main surface of the semiconductor chip 1000.

FIG. 16 illustrates a multi-layer carrier 2000 such as e.g., a PCB, an SBU or a ceramic substrate. The multi-layer carrier 2000 may be provided with a first conductive element 2003 made of conducting material 110 connecting a contact part (e.g., solder ball) 111 to a first internal conductive layer 2001 of the multi-layer carrier 2000. The multi-layer carrier 2000 may be provided with a second conductive element 2004 made of conducting material 110 connecting a contact part (e.g., solder ball) 111 to a second internal conductive layer 2002 of the multi-layer carrier 2000. The multi-layer carrier 2000 may be provided with a third conductive element 2005 made of a conducting material 110 and forming a feedthrough to connect a first contact part (e.g., solder ball) 111A at a main surface of the multi-layer carrier 2000 to a second contact part (e.g., solder ball) 111B at the opposite main surface of the multi-layer carrier 2000. The third conductive element 2005 may optionally be further connected to a third internal conductive layer 2006.

FIG. 17 illustrates a polymer housing 3000 attached to a semiconductor chip 1000. The polymer housing 3000 may be made of a photoresist material such as e.g., SU8. A recess 3001 in the lower surface of the polymer housing 3000 forms a cavity to accommodate a sheltered structure 3002 such as e.g., a sensor or emitting structure mounted on the semiconductor chip 1000. The recess 3001 can be fabricated by multi-frequency laser lithography and etching. The structure 3002 is connected via chip pads 3003 to an internal wiring (not illustrated) of the semiconductor chip 1000. Conductive elements 3004, 3005 made of conducting material 110 run through a side wall section 3006 of the polymer housing 3000 to connect the chip pads 3003 at the upper surface of the semiconductor chip 1000 to contact parts (e.g., solder balls) 111 at the upper surface of the polymer housing 3000. The contact parts 111 allow the assembly to be flip-chip mounted on a mounting platform 200 (see FIGS. 10, 11) or to serve as a carrier for a stacked device. The chip pads 3003 may provide the wettable material at the surface zone 103 of the bottom of the first partial openings 1021 as described in the aforementioned embodiments. The chip-and-housing structure illustrated in FIG. 17 may be completely manufactured on wafer level. In all structures 1000, 2000, 3000 illustrated in FIGS. 15 to 17, the contact elements formed by the conductive elements 1003, 1004, 2003, 2004, 2005, 3004, 3005 and the contact parts 111, 111A, 111B are manufactured in accordance with the principles explained by way of example in conjunction with FIGS. 1 to 14. The second partial cavities 1022 are not illustrated in FIGS. 15 to 17. It is to be noted that in the case of relatively long contact elements (e.g., contact elements 1004, 2004, 2005 forming feedthroughs or penetrating an internal conductive layer) the second partial cavities 1022 may not accompany the first partial cavities 1021 along their entire length but may end at a lower depth, e.g., at an internal conductive layer such as e.g., for the example illustrated in FIG. 16 at the uppermost internal conductive layers 2001, 2006, respectively.

Throughout the description, the filling of the cavities 102 by the conducting material 110 may be accomplished by using a molten metal suction method (MMSM). One embodiment of this filling method will now be explained in more detail with reference to FIGS. 18A to 18D.

Figure 18A:
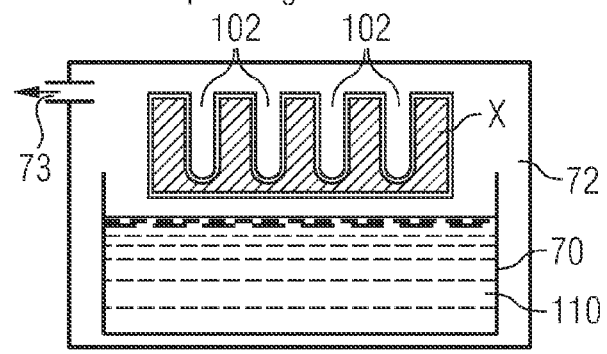
FIGS. 18A-D illustrate one embodiment of a process for filling openings in a structure using a molten metal suction method.

FIG. 18A illustrates in a schematic fashion a bath 70 of molten metal 110. The molten metal is the electrically conducting material 110, e.g., solder. The bath of molten metal 110 is arranged in a pressure chamber 72, which may be pressurized or decompressed at an inlet/outlet 73.

Figure 18B:
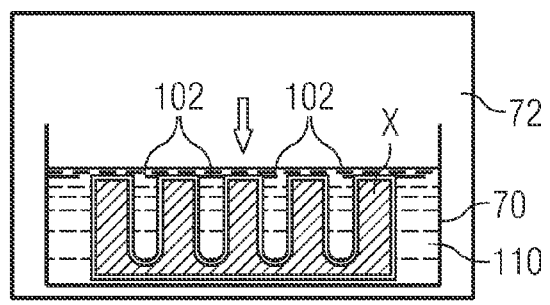
Figure 18C:
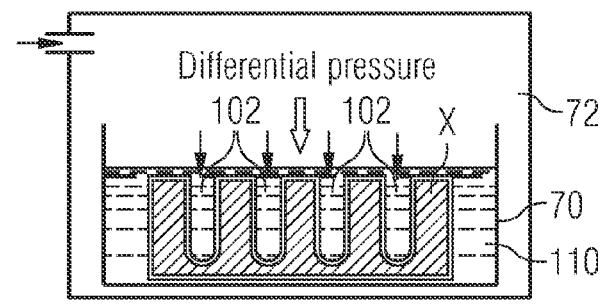
Figure 18D:
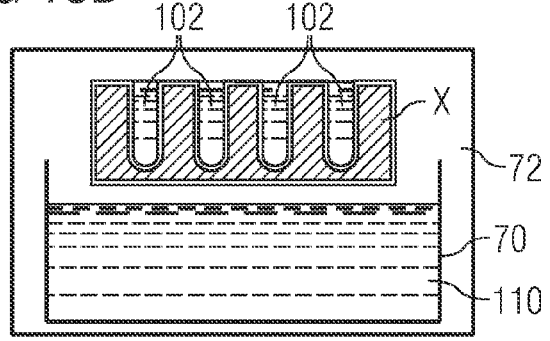

First, the pressure chamber 72 is decompressed, i.e. vacuum is applied. Then, as illustrated in FIG. 18B, the structure 100, arrangement 100, 101 or assembly 1000, 2000, 3000 referred to in FIGS. 18A-D by reference sign X, optionally at wafer level, is immersed into the molten metal bath 70. Then, after about e.g., one minute of immersion, the vacuum is broken and a pressure gas may be introduced into the chamber 72 up to e.g., atmospheric pressure or over-atmospheric pressure. At that time, as depicted in FIG. 18C, the cavities 102 are filled with molten metal 110 by the differential pressure between vacuum ambience in the cavities 102 and pressurized ambience of the chamber 72. After maintaining the pressure for e.g., a couple of minutes, the substrate X is taken out of the molten metal bath 70 and cooled down so that the metal within the cavities 102 solidifies. Then, the pressure is released and the structure X is removed from the pressure chamber 72.

Thus, the application of a reduced pressure makes it possible to introduce the conducting material 110 into narrow cavities 102 and to completely fill the same. The pressure in the airtight pressure chamber 72 at the decompressing process (FIG. 18A) may be within the range of e.g., 0.001 to 100 mbar, and optionally be less than 1 mbar. After the introduction of the liquefied conducting material 110 in the cavities 102, blind holes may be opened to form continuous holes (i.e. through-holes), if desired.

The pressure required for filling of the cavities 102 (FIG. 18C) mainly depends on the minimum lateral dimension of the cavities 102, i.e. S or H, and the surface tension of the conducting material. These parameters control the capillary pressure of the conducting material 110 within the cavities 102. The capillary pressure has to be overcome by the filling pressure applied during the filling of the cavities 102. The filling pressure may be within the range of e.g., 1 to 20 bar and optionally within the range of 5 to 10 bar.

By virtue of the pressure used during the filling of the cavities 102, the surface in the cavities 102 need not be provided with an adhesion layer for filling, even in the case of a poorly wettable electrically conducting material 110. The cavities 102 may be completely and bubble-free filled by the molten conducting material 110 up to the edge at the surface of the structure X. That is, all first and second partial cavities 1021, 1022 are filled by the molten conducting material 110. This allows to apply the conducting material 110 for the contact element, i.e. the conductive element extending within the first partial cavity 1021 of the structure X and the conducting material 110 forming the protruding contact part 111 projecting from the structure X in the same manufacturing step.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrical device, comprising:
   a structure defining an exposed main face, the structure comprising an array of cavities formed by a first partial cavity and a second partial cavity;
   overhang regions at the main face, each overhang region defining at least one opening to one cavity, the overhang regions comprising a passivation material;
   a first material provided at a first surface zone of the first partial cavity of each cavity, wherein the first material is wettable by an electrically conducting material;
   a second material provided at a second surface zone of the second partial cavity of each cavity, wherein the second material is less wettable by the electrically conducting material than the first material; and
   the electrically conducting material being contained in each cavity.

2. The electrical device of claim 1, wherein each cavity defines an area within a plane parallel to the main face that is larger than the area of the respective opening.

3. The electrical device of claim 1, wherein the first surface zone is located at the bottom of the first partial cavity of each cavity.

4. The electrical device of claim 1, wherein the second surface zone is located at the bottom of the second partial cavity of each cavity.

5. The electrical device of claim 1, wherein the electrically conducting material comprises solder.

6. The electrical device of claim 1, wherein each overhang region defines a plurality of openings.

7. The electrical device of claim 1, wherein the first surface zone has a circular shape and the second surface zone has a trench shape.

8. An electrical device, comprising:
   a structure defining an exposed main face, the structure comprising a cavity extending from the main face into the structure, the cavity formed by a first partial cavity and a second partial cavity;
   an overhang region extending from the main face of the structure over the cavity and defining at least one opening to the cavity, the overhang region comprising a passivation material;
   a first material provided at a first surface zone located at a bottom of the first partial cavity, wherein the first material is wettable by an electrically conducting material;
   a second material provided at a second surface zone located at the bottom of the second partial cavity, wherein the second material is less wettable by the electrically conducting material than the first material; and
   the electrically conducting material being within the cavity.

9. The electrical device of claim 8, wherein the cavity defines an area within a plane parallel to the main face that is larger than an area of the opening.

10. The electrical device of claim 8, wherein the electrically conducting material comprises solder.

11. The electrical device of claim 8, wherein the overhang region defines a plurality of openings to the cavity.

12. The electrical device of claim 8, wherein the first surface zone has a circular shape and the second surface zone has a trench shape.

13. The electrical device of claim 8, wherein the structure comprises a semiconductor material.

14. An electrical device, comprising:
   a structure;
   a cavity extending from an opening at an exposed main face of the structure into the structure, the cavity formed by a first partial cavity and a second partial cavity;
   a contact element made of an electrically conducting material, wherein the contact element fills the first partial cavity, extends through the opening and protrudes from the structure over the main face;
   the second partial cavity being devoid of the electrically conducting material; and
   an overhang region extending from the main face of the structure over the cavity and closing the second partial cavity at the main face of the structure, the overhang region comprising a passivation material.

15. The electrical device of claim 14, wherein the first partial cavity and the second partial cavity are aligned in a plane parallel to the main face of the structure.

16. The electrical device of claim 14, wherein the first partial cavity has a circular shape and the second partial cavity has a trench shape.

17. The electrical device of claim 14, further comprising:
   a first material provided at a first surface zone located at a bottom of the first partial cavity, wherein the first material is wettable by the electrically conducting material; and
   a second material provided at a second surface zone located at the bottom of the second partial cavity, wherein the second material is less wettable by the electrically conducting material than the first material.

18. The electrical device of claim 14, wherein the electrically conducting material comprises solder.

19. The electrical device of claim 14, wherein the cavity defines an area within a plane parallel to the main face that is larger than an area of the opening.

20. The electrical device of claim 14, wherein the structure comprises a semiconductor material.

\* \* \* \* \*